United States Patent
Fujimoto et al.

(10) Patent No.: US 12,245,493 B2
(45) Date of Patent: Mar. 4, 2025

(54) FILM-LAMINATED METAL SHEET, SUBSTRATE FOR FLEXIBLE DEVICE, AND SUBSTRATE FOR ORGANIC EL DEVICE

(71) Applicant: JFE STEEL CORPORATION, Tokyo (JP)

(72) Inventors: Soichi Fujimoto, Tokyo (JP); Yasuhide Oshima, Tokyo (JP); Katsumi Kojima, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 471 days.

(21) Appl. No.: 17/417,610

(22) PCT Filed: Dec. 19, 2019

(86) PCT No.: PCT/JP2019/049780
§ 371 (c)(1),
(2) Date: Jun. 23, 2021

(87) PCT Pub. No.: WO2020/137783
PCT Pub. Date: Jul. 2, 2020

(65) Prior Publication Data
US 2022/0093882 A1      Mar. 24, 2022

(30) Foreign Application Priority Data

Dec. 28, 2018   (JP) ................ 2018-246516

(51) Int. Cl.
| | |
|---|---|
| *B32B 15/09* | (2006.01) |
| *B32B 15/18* | (2006.01) |
| *B32B 15/20* | (2006.01) |
| *B32B 27/08* | (2006.01) |
| *B32B 27/20* | (2006.01) |
| *H10K 77/10* | (2023.01) |
| *H10K 102/00* | (2023.01) |

(52) U.S. Cl.
CPC ...... *H10K 77/111* (2023.02); *H10K 2102/311* (2023.02)

(58) Field of Classification Search
None
See application file for complete search history.

(56) References Cited

U.S. PATENT DOCUMENTS

| | | | | |
|---|---|---|---|---|
| 2009/0233089 A1* | 9/2009 | Nishio | ............... | B43L 1/00 428/421 |
| 2012/0015181 A1 | 1/2012 | Seo et al. | | |
| 2012/0156457 A1 | 6/2012 | Kondo | | |
| 2012/0207991 A1 | 8/2012 | Arai et al. | | |
| 2013/0236710 A1 | 9/2013 | Honda et al. | | |
| 2017/0240719 A1 | 8/2017 | Nishijima | | |
| 2018/0272679 A1 | 9/2018 | Sakamoto et al. | | |

FOREIGN PATENT DOCUMENTS

| | | |
|---|---|---|
| CN | 102640564 A | 8/2012 |
| CN | 106165112 A | 11/2016 |
| CN | 107791606 A | 3/2018 |
| EP | 3854837 A1 | 7/2021 |
| JP | H03-191507 A | 8/1991 |
| JP | 2003-291251 A | 10/2003 |
| JP | 2009-81124 A | 4/2009 |
| JP | 2014-208479 A | 11/2014 |
| JP | 2015-195315 A | 11/2015 |
| JP | 2016-163991 A | 9/2016 |
| JP | 2016-215519 A | 12/2016 |
| KR | 10-2016-0129870 A | 11/2016 |
| KR | 10-2017-0126851 A | 11/2017 |
| TW | I513360 B | 12/2015 |
| WO | 2011/024690 A1 | 3/2011 |
| WO | 2011/027815 A1 | 3/2011 |
| WO | 2012/077553 A1 | 6/2012 |
| WO | 2015/151773 A1 | 10/2015 |
| WO | 2016/001971 A1 | 1/2016 |
| WO | 2016/060167 A1 | 4/2016 |

OTHER PUBLICATIONS

Jan. 12, 2022 Extended European Search Report issued in Patent Application No. 19906472.6.
Oct. 8, 2022 Office Action issued in Chinese Patent Application No. 201980086399.0.
Oct. 21, 2022 Office Action issued in Korean Patent Application No. 2021-7023526.
Oct. 6, 2020 Office Action issued in Taiwanese Patent Application No. 108147506.
Mar. 10, 2020 Search Report issued in International Patent Application No. PCT/JP2019/049780.

* cited by examiner

*Primary Examiner* — Sheeba Ahmed
(74) *Attorney, Agent, or Firm* — Oliff PLC

(57) ABSTRACT

A film-laminated metal sheet including a resin film configured to coat a metal sheet on at least one surface, wherein an arithmetic mean height $Sa_0$ of a surface of the resin film is 3.0 nm or smaller, and an arithmetic mean height change ratio $\{(Sa_1/Sa_0) \times 100\}$ of the surface of the resin film is 80% to 120%, where $Sa_1$ denotes an arithmetic mean height of the surface of the resin film after thermal treatment at 100° C.

21 Claims, No Drawings

FILM-LAMINATED METAL SHEET, SUBSTRATE FOR FLEXIBLE DEVICE, AND SUBSTRATE FOR ORGANIC EL DEVICE

FIELD

The present invention relates to a film-laminated metal sheet, a substrate for a flexible device, and a substrate for an organic EL device.

BACKGROUND

Flexible devices are a generic name for devices characterized in that the devices are formed of a flexible material and able of being bent. A variety of functional products can be created by combining organic electronics based on organic materials, and printed electronics that can produce devices easily and at low cost by coating or printing, for example. Flexible devices include various devices such as organic electro-luminescence (EL) devices, organic thin-film solar cells, organic thin-film transistors (TFT), electronic paper, flexible cells, and a variety of flexible sensors.

Conventionally, flexible devices such as organic EL devices have been formed mainly with, for example, glass having excellent planarity, heat resistance, and gas barrier characteristics, and resin films having excellent flexibility. However, it is not easy to satisfy all of planarity, heat resistance, gas barrier characteristics, and flexibility, which are the most important for flexible device substrates. Attempts therefore have been made, for example, to reduce the thickness and increase the strength of glass to impart flexibility or provide a gas barrier layer on a surface of a resin film to impart the gas barrier characteristics. Still, there are many problems such as insufficient performance and high cost. Then, in order to solve these problems, methods of coating a metal sheet with an insulating film have started to be developed.

As a method of coating a metal sheet with an insulating film, Patent Literature 1 proposes a method of forming an insulating coating containing at least one of $Al_2O_3$ and $SiO_2$ by thermal oxidation on a steel material having controlled Al and Si contents, and further forming an insulating coating from a silica-based inorganic-organic hybrid material. Patent Literature 2 proposes a method of forming an insulating film on a metal sheet by baking a coating-forming composition containing a thermosetting resin and in which a volume fraction of a solid pigment is 20% or less. Patent Literature 3 proposes a metal sheet laminated with a thermoplastic resin film with an adhesive, in which the resin film contains a solid pigment in a volume fraction of 20% or less.

CITATION LIST

Patent Literature

Patent Literature 1: WO2016/001971
Patent Literature 2: Japanese Patent Application Laid-open No. 2014-208479
Patent Literature 3: Japanese Patent Application Laid-open No. 2015-195315

SUMMARY

Technical Problem

Unfortunately, the method described in Patent Literature 1 has high environmental impact because the method uses an organic solvent and requires thermal treatment at high temperature. Moreover, an insulating film is a thin coating, the main component of which is an inorganic material, and therefore has poor flexibility. The method described in Patent Literature 2 also involves a process that uses an organic solvent and requires drying and solidification by thermal treatment. Furthermore, the method described in Patent Literature 3 costs more to apply an adhesive and, in addition, involves a process with poor productivity because it takes time to solidify the adhesive.

The present invention is made in view of the problems described above. An object of the present invention is to provide a film-laminated metal sheet, a substrate for a flexible device, and a substrate for an organic EL device that have low environmental impact and high productivity in addition to satisfying smoothness, heat resistance, flexibility, and gas barrier characteristics required for substrate for flexible devices.

Solution to Problem

To solve the problem and achieve the object, a film-laminated metal sheet according to the present invention includes a resin film configured to coat a metal sheet on at least one surface, wherein an arithmetic mean height $Sa_0$ of a surface of the resin film is 3.0 nm or smaller, and an arithmetic mean height change ratio $\{(Sa_1/Sa_0) \times 100\}$ of the surface of the resin film is 80% to 120%, where $Sa_1$ denotes an arithmetic mean height of the surface of the resin film after thermal treatment at 100° C.

Moreover, in the film-laminated metal sheet according to the present invention, a ten-point height $S10z_0$ of the surface of the resin film is 50 nm or smaller.

Moreover, in the film-laminated metal sheet according to the present invention, a ten-point height change ratio $\{(S10z_1/S10z_0) \times 100\}$ of the surface of the resin film is 80% to 120%, where $S10z_1$ denotes a ten-point height of the surface of the resin film after thermal treatment at 100° C.

Moreover, in the film-laminated metal sheet according to the present invention, a glossiness of the surface of the resin film is 100 or more.

Moreover, in the film-laminated metal sheet according to the present invention, a thickness of the resin film is 10 μm to 50 μm.

Moreover, in the film-laminated metal sheet according to the present invention, 80 mass % or more of a component in the resin film is a polyester resin.

Moreover, in the film-laminated metal sheet according to the present invention, the metal sheet is coated with the resin film by thermocompression lamination.

Moreover, a substrate for a flexible device according to the present invention is the substrate being configured to use the film-laminated metal sheet according to the present invention.

Moreover, a substrate for an organic EL device according to the present invention is the substrate being configured to use the film-laminated metal sheet according to the present invention.

Advantageous Effects of Invention

The present invention can provide a film-laminated metal sheet, a substrate for a flexible device, and a substrate for an organic EL device that have low environmental impact and high productivity in addition to satisfying smoothness, heat resistance, flexibility, and gas barrier characteristics required for substrate for flexible devices.

DESCRIPTION OF EMBODIMENTS

A film-laminated metal sheet according to the present invention will be described below.

In the film-laminated metal sheet according to the present invention, at least one surface of the metal sheet is coated with a resin film. When the metal sheet is used for, for example, an organic EL device, both of flexibility and gas barrier characteristics are excellent. In addition, coating at least one surface with the resin film can impart smoothness of the resin film. Since the resin film and the metal sheet are laminated, the film is retained even when heated, and heat resistance is more excellent than that of the resin film alone.

In the film-laminated metal sheet according to the present invention, an arithmetic mean height $Sa_0$ of a surface of the resin film is 3.0 nm or smaller. The arithmetic mean height $Sa_0$ of the surface of the resin film is more preferably 1.1 nm or smaller, further preferably 0.80 nm or smaller, particularly preferably 0.50 nm or smaller. When the arithmetic mean height $Sa_0$ exceeds 3.0 nm, for example, in the use for the organic EL device, a short circuit occurs between electrodes and the organic EL device does not emit light in some cases. Ideally, the arithmetic mean height $Sa_0$ is closer to 0 from the above perspective, but substantially, the lower limit is 0.1 nm. In order to set the arithmetic mean height $Sa_0$ of the surface of the resin film within the range above, it is important to perform pressure-bonding such that the surface shape of the resin film does not deteriorate when the resin film is laminated as described later. Since the arithmetic mean height $Sa_0$ is deteriorated by scratches and the like during transportation, it is also preferable to enhance slippability of the surface of the resin film so as not to affect its surface roughness.

In the film-laminated metal sheet according to the present invention, when the arithmetic mean height of the surface of the resin film after thermal treatment at 100° C. is $Sa_1$, the arithmetic mean height change ratio $\{(Sa_1/Sa_0) \times 100\}$ is 80% or more and 120% or less. The arithmetic mean height change ratio is more preferably 85% or more and 115% or less, further preferably 90% or more and 110% or less, particularly preferably 92% or more and 108% or less. When the arithmetic mean height change ratio is less than 80% or exceeds 120%, that is, the change in the surface state by thermal treatment is large, for example, the surface state may change due to heat generated in a process after the organic EL device is fabricated on the metal sheet. In such a case, deforming the organic EL device as a whole may cause luminance non-uniformity or a short circuit. In order to set the arithmetic mean height change ratio within the range above, it is important to coat the metal sheet with a resin film described later and perform pressure-bonding under a certain lamination condition.

In the film-laminated metal sheet according to the present invention, it is preferable that a ten-point height $S10z_0$ of the surface of the resin film is 50 nm or smaller. The ten-point height $S10z_0$ of the surface of the resin film is more preferably 45 nm or smaller, further preferably 40 nm or smaller, particularly preferably 35 nm or smaller. When the ten-point height $S10z_0$ is 50 nm or smaller, the incidence of defects such as a short circuit between electrodes or the incidence of defects such as dark spots can be suppressed extremely low in the use for the organic EL device. Ideally, the ten-point height $S10z_0$ is closer to 0 nm from the above perspectives, but substantially, the lower limit is 0.5 nm. In order to set the ten-point height $S10z_0$ within the range above, it is important to perform pressure-bonding such that the film surface shape does not deteriorate when the resin film is laminated as described later. It is also important to maintain a high degree of cleanness in a manufacturing place because the ten-point height $S10z_0$ deteriorates also when foreign substances and the like adhere during manufacturing of the film-laminated metal sheet.

In the film-laminated metal sheet according to the present invention, it is preferable that when the ten-point height of the surface of the resin film after thermal treatment at 100° C. is $S10z_1$, the ten-point height change ratio $\{(S10z_1/S10z_0) \times 100\}$ is 80% or more and 120% or less. The ten-point height change ratio is more preferably 85% or more and 110% or less, further preferably 90% or more and 110% or less, particularly preferably 92% or more and 108% or less. When the ten-point height change ratio is 80% or more and 120% or less, the incidence of defects such as dark spots can be suppressed extremely low in the use for the organic EL device. In order to set the ten-point height change ratio within the range above, it is important to coat the metal sheet with a resin film described later and perform pressure-bonding under a certain lamination condition.

In the film-laminated metal sheet according to the present invention, it is preferable that the glossiness of the surface of the resin film is 100 or more. The glossiness of the surface of the resin film is more preferably 105 or more, further preferably 110 or more, particularly preferably 115 or more. When the glossiness is 100 or more, light impinging on the substrate surface can be extracted more efficiently to the outside in the use for the organic EL device. Furthermore, the incidence of defects such as dark spots can be suppressed extremely low. Although a higher glossiness is preferable for the reason above, 150 or so is presumably the limit in the case of the film-laminated metal sheet.

In the film-laminated metal sheet according to the present invention, it is preferable that the thickness of the resin film is 10 μm or larger and 50 μm or smaller. The thickness of the resin film is more preferably 12 μm or larger and 40 μm or smaller, further preferably 15 μm or larger and 35 μm or smaller, particularly preferably 18 μm or larger and 30 μm or smaller. When the thickness of the resin film is 10 μm or larger, a film-laminated metal sheet with a resin film having a smoother surface can be obtained. When the thickness of the resin film is 50 μm or smaller, the incidence of defects such as dark spots due to moisture contained in the resin film can be suppressed extremely low, and a film-laminated metal sheet having less effect on the lifetime of the organic EL device can be obtained.

In the film-laminated metal sheet according to the present invention, it is preferable that a main component of resin of the resin film is a polyester resin. As used herein "main component" means that the proportion of a certain component in all the components is 80 mass % or more, more preferably 85 mass % or more, further preferably 90 mass % or more, particularly preferably 95 mass % or more. The proportion may be 100 mass %. It is preferable that the polyester resin is a resin obtained by polymerization of a monomer mainly composed of an aromatic dicarboxylic acid or an aliphatic dicarboxylic acid and a diol, or a mixture thereof.

Here, examples of the aromatic dicarboxylic acid include terephthalic acid, isophthalic acid, phthalic acid, naphthalene dicarboxylic acid, diphenyl dicarboxylic acid, diphenyl ether dicarboxylic acid, diphenyl sulfone dicarboxylic acid, diphenoxyethane dicarboxylic acid, and 5-sodium sulfoisophthalic acid. Examples of the aliphatic dicarboxylic acid include oxalic acid, succinic acid, adipic acid, suberic acid, sebacic acid, dimer acid, maleic acid, fumaric acid, dodecanedioic acid, cyclohexane dicarboxylic acid, and ester derivatives thereof. These acid components may be used singly or may be used in combination of two or more, or may be copolymerized with, for example, an oxycarboxylic acid such as para-oxybenzoic acid.

Examples of the diol component include ethylene glycol, propanediol, butanediol, pentanediol, hexanediol, neopentyl glycol, cyclohexanedimethanol, diethylene glycol, triethylene glycol, polyalkylene glycol, 2,2-bis(4-hydroxyethoxyphenyl)propane, isosorbide (1,4:3,6-dianhydroglucitol, 1,4:3,6-dianhydro-D-sorbitol), spiroglycol, bisphenol A, and bisphenol S. Among those, ethylene glycol is preferably used. These diol components may be used singly or may be used in combination of two or more.

As the polyester resin used in the film-laminated metal sheet according to the present invention, among the polyesters listed above, polyethylene terephthalate (PET) and polyethylene naphthalate (PEN) are preferable in terms of adhesion to the metal sheet and heat resistance. A mixture thereof may be preferably used.

In the resin film used in the film-laminated metal sheet according to the present invention, a polyfunctional compound such as trimellitic acid, trimesic acid, or trimethylolpropane may be copolymerized as long as the effect of the present invention is not hindered. A resin component other than polyester may be added for the purpose of imparting functionality. Examples of the resin component include linear polyolefins such as polyethylene, polypropylene, poly (4-methylpentene-1), and polyacetal, alicyclic polyolefins such as ring-opening metathesis polymers, addition polymers, and addition copolymers with other olefins of norbornenes, biodegradable polymers such as polylactic acid and polybutylene succinate, polyamides such as nylon 6, nylon 11, nylon 12, and nylon 66, aramid, polymethyl methacrylate, polyvinyl chloride, polyvinylidene chloride, polyvinyl alcohol, polyvinyl butyral, ethylene-vinyl acetate copolymer, polyacetal, polyglycolic acid, polystyrene, styrene-polymethyl methacrylate copolymer, polycarbonate, polyethersulfone, polyether ether ketone, modified polyphenylene ether, polyphenylene sulfide, polyetherimide, polyimide, polyarylate, tetrafluoroethylene resin, trifluoroethylene resin, tri fluorochloroethylene resin, tetrafluoroethylene-hexafluoropropylene copolymer, and polyvinylidene fluoride. These may be a copolymer or a mixture.

The glass transition temperature of the resin film according to the present invention is not particularly limited, and is preferably 60° C. or higher and 130° C. or lower, further preferably 70° C. or higher and 100° C. or lower, in terms of achieving both of adhesion to the metal sheet and heat resistance. The melting point of the resin film is not particularly limited, and is preferably 220° C. or higher and 280° C. or lower, further preferably 240° C. or higher and 260° C. or lower, in terms of achieving both of adhesion to the metal sheet and heat resistance.

It is preferable that a known antioxidant is added in the amount of 0.0001 mass % or more and 1.0 mass % or less to the resin film used in the film-laminated metal sheet according to the present invention, in terms of improving heat resistance. The amount of the antioxidant is further preferably 0.001 mass % or more and 1.0 mass % or less. The kind of the antioxidant is not particularly limited and, for example, known antioxidants classified as hindered phenols, hydrazines, and phosphites can be used.

In the resin film used in the film-laminated metal sheet according to the present invention, a variety of additives may be contained in addition to the antioxidant described above, in a range that does not hinder the effect of the present invention. Examples of the additives include slip additive, nucleator, heat stabilizer, antistatic agent, anti-blocking agent, filler, and viscosity adjuster. These may be mixed in the resin film. However, in particular, a slip additive and/or an anti-blocking agent may be mixed with a solvent and applied as a slurry on the film surface and then dried to impart functions.

The resin film used in the film-laminated metal sheet in the present invention can be preferably used in the form of a single layer of the same resin component, but a stack structure of two or more layers may also be preferable for the purpose of imparting functionality. As an advantage in the case of a stack structure, for example, a surface layer stacked on the metal sheet may be formed of a composition with high adhesion to the metal sheet, and a surface layer on the opposite side may be formed of a resin composition having high scratch resistance and high heat resistance, thereby imparting various functions. The stacking direction may be the longitudinal direction or the width direction, as an alternative to the thickness direction described above. However, stacking in the thickness direction is preferable in terms of imparting the function as the film-laminated metal sheet. The stacking method may be, for example, coextrusion using a feed block technique or a multi-manifold technique, or lamination such as laminating with another film or depositing a melted resin directly on the film. Any of these methods can be used.

A method of manufacturing the film-laminated metal sheet according to the present invention will now be described. However, the present invention is not limited thereto. In manufacturing the film-laminated metal sheet according to the present invention, first, the preferable polyester resin described above is prepared in the form of pellets or the like. The pellets are dried in hot air or under a vacuum, if necessary, and then supplied with a variety of additives to an extruder. In the extruder, the resin heated to the melting point or higher and melted is extruded in a uniform amount by a gear pump or the like and is passed through a filter or the like to remove foreign substances, a denatured resin, and the like. In the case of a stack structure, a resin is supplied to an extruder different from the above, and the resins are fed to a stacking device through individual different channels. A feed block or a multi-manifold die can be used as the stacking device.

These resins are formed into the shape of a sheet in a T die and then discharged. Then, a melted sheet discharged from the T die is pushed out onto a cooler such as a casting drum and then cooled and solidified, resulting in a cast film. In doing so, in order to enhance the intimate contact between the cooler such as the casting drum and the melted sheet, it is preferable that an electrode in the form of wire, tape, needle, knife, or the like is used to bring the sheet into intimate contact by electrostatic force and rapidly cool and solidify the sheet. A method of blowing the air from a slit-like, spot-like, or surface-like device to bring the sheet into intimate contact and rapidly cool and solidify the sheet, a method of using a nip roll to bring the sheet into intimate contact and rapidly cool and solidify the sheet, and a combination of these methods are also preferable.

It is preferable that the thus obtained cast film is biaxially stretched in the lengthwise direction (longitudinal direction) and the lateral direction (width direction). As a method of biaxially stretching, a sequential biaxial stretching method in which the film is stretched in the lengthwise direction and thereafter stretched in the lateral direction or stretched in the lateral direction and thereafter stretched in the lengthwise direction, or a simultaneous biaxial stretching method in which the film is stretched simultaneously in the lengthwise direction and the lateral direction can be used. In the sequential biaxial stretching method, it is preferable that the film is stretched in the lengthwise direction and thereafter stretched in the lateral direction, in terms of achieving uniform quality and facility space saving. Here, the sequential biaxial stretching method in which the film is stretched in the lengthwise direction and thereafter stretched in the lateral direction will be described.

First, the resulting cast film is stretched in the lengthwise direction. As used herein the lengthwise stretching means stretching for applying molecular orientation in the longitudinal direction to the film. This stretching is usually carried out by a peripheral speed difference between rolls, and the stretching in the traveling direction may be performed in one step or may be performed using a plurality of roll pairs in multiple steps. The stretching ratio in the lengthwise stretching is, although it varies with the kinds of resin, preferably 2.0 times or more and 6.0 times or less. The stretching ratio is more preferably 2.5 times or more and 5.0 times or less, further preferably 2.8 times or more and 4.5 times or less. When the stretching ratio is within the range above, a film with less thickness unevenness can be obtained efficiently.

The stretching temperature in the lengthwise stretching is preferably the glass transition temperature of the resin forming the resin film or higher and the glass transition temperature+100° C. or lower. The stretching temperature is further preferably the glass transition temperature+10° C. or higher and the glass transition temperature+80° C. or lower, particularly preferably the glass transition temperature+20° C. or higher and the glass transition temperature+70° C. or lower. When the stretching temperature is within the range above, a film less shrunken during lamination can be obtained efficiently.

The uniaxially stretched resin film is once slowly cooled and then introduced into a tenter-type stretcher which grips the end portions of the resin film. The stretching ratio in the lateral stretching is preferably 2.5 times or more and 10.0 times or less, more preferably 3.0 times or more and 8.0 times or less, further preferably 3.5 times or more and 6.0 times or less. When the stretching ratio is within the range above, a film with less thickness unevenness and less shrunken during lamination can be obtained efficiently.

The stretching temperature in the lateral stretching is preferably the glass transition temperature of the resin forming the resin film or higher and the glass transition temperature+100° C. or lower. The stretching temperature is more preferably the glass transition temperature+20° C. or higher and the glass transition temperature+80° C. or lower, particularly preferably the glass transition temperature+30° C. or higher and the glass transition temperature+70° C. or lower. When the stretching temperature is within the range above, a film with less thickness unevenness and less shrunken during lamination can be obtained efficiently.

It is preferable that the film stretched in the lateral direction is thereafter thermally fixed. The thermal fixation is preferably performed in a tenter heated to a high temperature, and the thermally fixing temperature is preferably the stretching temperature in the lateral stretching or higher and the melting point−50° C. or lower. The thermally fixing temperature is further preferably the stretching temperature in the lateral direction+20° C. or higher and the melting point−60° C. or lower, particularly preferably the stretching temperature in the lateral stretching+40° C. or higher and the melting point−70° C. or lower.

Furthermore, the thermal fixation may be performed while the film is loosened in the longitudinal direction and/or the width direction. The loosening ratio is preferably 0.3% or more and 5.0% or less, more preferably 0.5% or more and 4.0% or less, further preferably 0.8% or more and 3.0% or less. It is preferable that loosening is performed simultaneously with thermal fixation because the residual stress of the biaxially oriented resin film is further reduced. When the loosening ratio is within the range above, the residual stress can be reduced more effectively. The thermally fixed resin film is thereafter slowly cooled in the tenter, resulting in a biaxial oriented film.

A manufacturing process for laminating these resin films on a metal sheet is not particularly limited. A thermocompression process is preferable in which the metal sheet is heated at a temperature exceeding the melting point of the resin film and the resin film is brought into contact with one surface or both surfaces of the metal sheet using a pressure roll (thermocompression film-laminating process). In the use for a substrate for a flexible device, a transparent electrode such as ITO may be formed on the surface by etching, but the metal sheet may dissolve into an etching solution. It is therefore preferable to laminate resin films on both surfaces of the metal sheet. The resin film on the surface opposite to the surface coated with the resin film according to the present invention is not particularly limited as long as it is a resin film that adheres to the metal sheet, but a thermoplastic resin film is preferable. For example, a commercially available PET film can be used.

Since the resin film that coats the film-laminated metal sheet according to the present invention needs to keep heat resistance, it is preferable that only a portion with a slight thickness in contact with the metal sheet is melted and allowed to adhere to the metal sheet. Specific lamination conditions are described below. The temperature at the start of lamination is preferably the melting point−20° C. or higher and the melting point or lower, more preferably the melting point−15° C. or higher and the melting point−5° C. or lower. It is preferable that, as a temperature history applied to the film during lamination, the time during which the film is pressed by a laminate roll is 1.0 msec or longer and 10 msec or shorter. It is preferable that the pressing by the pressure roll during lamination is 5 kgf/cm$^2$ or higher and 15 kgf/cm$^2$ or lower as a contact pressure. Within this range, a film-laminated metal sheet excellent in adhesion and surface smoothness can be obtained. The pressing by the pressure roll is more preferably 5 kgf/cm$^2$ or higher and 13 kgf/cm$^2$ or lower, further preferably 5 kgf/cm$^2$ or higher and 12 kgf/cm$^2$ or lower.

It is further preferable that the surface that does not adhere to the metal sheet, that is, the front surface side of the resin film is cooled so as not to be affected by a heat history. As a method of cooling the front surface side of the resin film, for example, a method of nipping the resin film by a cooling roll, a method of cooling the front surface by a cooling gas, a method of surrounding the periphery of the laminated portion with a cooling tank may be employed. The method of nipping the resin film by the cooling roll is preferable. The cooling roll temperature is preferably 0° C. or higher and 25° C. or lower. The laminate cooling roll temperature is more preferably 0° C. or higher and 20° C. or lower, further preferably 0° C. or higher and 18° C. or lower. It is preferable that the laminated metal sheet is water-cooled immediately so that the heat resistance of the resin film is not impaired. It is preferable that the time from the resin film pressure-bonding to water cooling is 0.1 seconds or longer and 0.8 seconds or shorter. Within this range, a film-laminated metal sheet with higher heat resistance can be obtained.

As the metal sheet according to the present invention, an aluminum sheet, a soft steel sheet, and the like widely used as materials for cans can be used. In particular, for example, a surface-treated steel sheet (called TFS) having a double-layer coating including a lower layer of metal chromium and an upper layer of hydrated chromium is most suitable. The amount of deposition of the metal chromium layer and the hydrated chromium layer of the TFS is not particularly limited. In terms of adhesion after processing and corrosion resistance, it is desirable that the amount of metal chromium layer is 50 mg/m$^2$ or more and 200 mg/m$^2$ or less, and the amount of hydrated chromium layer is 5 mg/m$^2$ or more and 35 mg/m$^2$ or less, both in terms of Cr.

It is preferable that the thickness of the metal sheet is 0.05 mm or larger and 0.5 mm or smaller. When the thickness is 0.05 mm or larger, the thermocompression laminating process described above is easily adopted. When the thickness is 0.5 mm or smaller, a film-laminated metal sheet with higher flexibility can be obtained. The thickness is more preferably 0.1 mm or larger and 0.3 mm or smaller.

The film-laminated metal sheet according to the present invention can be suitably used as a substrate for a flexible device in terms of smoothness, heat resistance, flexibility, and gas barrier characteristics and, in particular, preferably used for the organic EL device.

EXAMPLES

The present invention will be described in detail below with examples. The properties were measured and evaluated by the methods described below.

(1) Arithmetic Mean Height and Ten-Point Height

Measurement was performed using E-sweep manufactured by SII NanoTechnology Inc. and a Si cantilever with an Al-coated rear surface, manufactured by Hitachi High-Tech Science Corporation, as a cantilever, in DFM mode (for a surface shape image). The measurement range was 10 μm×10 μm, and the measurement was performed in the atmosphere at room temperature. For the resin film of the film-laminated metal sheet, three points randomly selected were measured in accordance with ISO 25178 to obtain the arithmetic mean height and the ten-point height as well as mean values thereof. For thermal treatment, the film-laminated metal sheet cut into a size of 50 mm×50 mm was left still, with the resin film surface facing up, in a hot air oven at an atmosphere temperature of 100° C. for three minutes, and thereafter removed and slowly cooled at room temperature. The arithmetic mean height and the ten-point height before the thermal treatment were $Sa_0$ and $S10z_0$, respectively, and the arithmetic mean height and the ten-point height after the thermal treatment were $Sa_1$ and $S10z_1$, respectively.

(2) Glossiness

The resin film surface of the film-laminated metal sheet was measured (at an angle of 20°) using a handy gloss meter (PG-1M) manufactured by NIPPON DENSHOKU INDUSTRIES Co., Ltd. The film surface was measured five times in a randomly selected direction and location, and the mean value thereof was set as the glossiness.

(3) Resin Film Thickness

The metal sheet of the film-laminated metal sheet was dissolved by hydrochloric acid, and the resin film was extracted. The thickness of the extracted resin film was measured using a dial indicator 2110S-10 (contact point with a carbide-tipped ball point) manufactured by Mitutoyo Corporation, installed in a dial indicator stand 7001-10 manufactured by Mitutoyo Corporation. The measurement was performed at 10 points randomly selected, and the mean value thereof was set as the thickness of the resin film.

(4) Thermal Characteristics of Resin Film (Melting Point, Glass Transition Temperature)

The film-laminated metal sheet was cut into a sample size of 10 mm×10 mm and soaked in hydrochloric acid to dissolve only the metal sheet, and the resin film was isolated. The isolated resin film in the amount of 5 mg was extracted as a sample in an aluminum pan and measured using a differential scanning calorimeter (DSCQ100) manufactured by TA Instruments. First, the sample was cooled to −50° C. under a nitrogen atmosphere and then the temperature was increased up to 290° C. at 20° C./minute (1st Run). The peak temperature of the melting peak with a melting enthalpy of 5 J/g or greater was determined from a chart obtained in the 1st Run measurement. Similar measurement was performed three times, and the mean value thereof was set as the melting point. The temperature was increased up to 290° C. in the measurement above and then held for five minutes, and the sample was rapidly cooled by liquid nitrogen. Subsequently, the temperature was increased again from −50° C. to 290° C. at 20° C./minute (2nd Run). The glass transition temperature was determined from a chart obtained in the 2nd Run measurement. Similar measurement was performed three times, and the mean value thereof was set as the glass transition temperature.

(5) Suitability for Organic EL Device Substrate

The film-laminated metal sheet was used as a substrate, and an anode (aluminum/gold electrode), a hole transport layer, an emissive layer/electron transport layer, and a translucent cathode (silver electrode) were vacuum-deposited in this order on the surface of the resin film. A metal mask was provided such that the emissive area was 2 mm×2 mm. A specific method of fabricating an organic EL device is described below. First, the substrate was washed with an organic solvent. Subsequently, the substrate was attached to the inside of a vacuum deposition system, which was decompressed to 0.001 Pa or lower. Subsequently, aluminum and gold were deposited as an anode, and α-NPD (N,N'-diphenyl-N,N'-di(α-naphthyl)-benzidine) was formed as a hole transport layer at a deposition rate of 6 nm/min to a film thickness of 50 nm so as to cover the anode. On this hole transport layer, $Alq_3$ (tris-(8-hydroxyquinoline)aluminum) was formed as an emissive layer/electron transport layer at a deposition rate of 6 nm/min to a film thickness of 50 nm. Finally, silver was deposited as a translucent electrode to form a cathode. The thus fabricated organic EL device was sealed and subjected to thermal treatment at 100° C. for three minutes. Power was supplied at an applied voltage of 15 V to the organic EL device cooled to room temperature, and organic electro-luminescence was observed. The suitability for an organic EL device substrate was evaluated based on the criteria below.

A (excellent): light emission over the entire surface with no defects

B (good): light emission with partial dark spots

C (fail): short-circuited immediately after light emission, or no light emission (6) Light Emission Appearance of Organic EL Device (dark spot count)

An organic EL device was fabricated in the same manner as described in the section above, and organic electro-luminescence was observed when power was supplied at an applied voltage of 10 V. The number of dark spots in the device was counted, and the light emission appearance of the organic EL device was evaluated based on the criteria below.
A (excellent): dark spot count of zero.
B (good): dark spot count of 1 to 100.
C (fail): dark spot count of 101 or more, or no light emission.

Example 1

Pellets of PET which is a polyester resin were prepared as a raw material resin of the resin film and dried sufficiently in a vacuum at a high temperature so as not to contain moisture. This was charged into a uniaxial extruder and melted and kneaded at 280° C. Subsequently, foreign substances were removed through a sintered filter with a cutoff size of 25 μm, and the resin was discharged from a T die and cooled and solidified on a casting drum with a surface temperature controlled to 25° C., resulting in a cast film. Subsequently, preheating was performed using a heated ceramic roll such that the resin film temperature reached 100° C., and the resin film was stretched in the lengthwise direction by 3.8 times. Subsequently, the resin film was introduced into a tenter-type stretcher with its end portions gripped by clips, and stretched in the lateral direction at 120° C. by 4.5 times. In this state, the resin film was loosened in the lateral direction by 1.0% while being thermally fixed at 165° C. Subsequently, the resin film was slowly cooled to room temperature, and the resin film with its end portions removed was taken up by a winder, resulting in a biaxial oriented film having a thickness of 30 μm. Subsequently, the resulting biaxial oriented film was laminated on a metal sheet. As the metal sheet, TFS (metal Cr layer: 120 mg/m$^2$, Cr oxide layer: 10 mg/m$^2$ in terms of metal Cr) having a thickness of 0.22 mm was used, and both surfaces of the metal sheet were coated with the above resin film using the thermocompression film-laminating process. The biaxial oriented film obtained as described above was laminated on one surface of the metal sheet, and a PET film manufactured by Toray Industries, Inc. (Lumirror S10: 20 μm) was laminated on the other surface. Specific lamination conditions were as follows: the metal sheet temperature immediately before lamination was 239° C., the laminate cooling roll temperature was 0° C., and the laminate pressing contact pressure was 5 kgf/cm$^2$. For the temperature during lamination, the temperature before lamination was measured (at a position 100 mm from the nip position) by a radiation thermometer.

Subsequently, the laminate was water-cooled 0.8 seconds after thermocompression, resulting in a film-laminated metal sheet with both surfaces of the metal sheet coated with the resin film. The physical properties of the resulting film-laminated metal sheet are listed in Table 1 below.

Example 2

A film-laminated metal sheet was obtained similarly to Example 1 except that the polyester resin was PEN, the stretching temperature in lengthwise stretching was 140° C., the stretching temperature in lateral stretching was 150° C., the thermally fixing temperature was 190° C., and the metal sheet temperature immediately before lamination was 250° C. The physical properties of the resulting film-laminated metal sheet are listed in Table 1 below.

Example 3

A film-laminated metal sheet was obtained similarly to Example 1 except that the laminate cooling roll temperature was 25° C. The physical properties of the resulting film-laminated metal sheet are listed in Table 1 below.

Example 4

A film-laminated metal sheet was obtained similarly to Example 1 except that the laminate cooling roll temperature was 20° C. The physical properties of the resulting film-laminated metal sheet are listed in Table 1 below.

Example 5

A film-laminated metal sheet was obtained similarly to Example 1 except that the resin film temperature was set to 90° C. when the cast film was stretched in the lengthwise direction. The physical properties of the resulting film-laminated metal sheet are listed in Table 1 below.

Example 6

A film-laminated metal sheet was obtained similarly to Example 1 except that the resin film temperature was set to 85° C. when the cast film was stretched in the lengthwise direction. The physical properties of the resulting film-laminated metal sheet are listed in Table 1 below.

Example 7

A film-laminated metal sheet was obtained similarly to Example 1 except that the laminate pressing contact pressure was set to 15 kgf/cm$^2$. The physical properties of the resulting film-laminated metal sheet are listed in Table 1 below.

Example 8

A film-laminated metal sheet was obtained similarly to Example 1 except that the laminate pressing contact pressure was set to 13 kgf/cm$^2$. The physical properties of the resulting film-laminated metal sheet are listed in Table 1 below.

Example 9

A film-laminated metal sheet was obtained similarly to Example 1 except that the discharge amount of the melted resin was controlled to form a biaxial oriented film having a thickness of 10 μm. The physical properties of the resulting film-laminated metal sheet are listed in Table 1 below.

Example 10

A film-laminated metal sheet was obtained similarly to Example 1 except that the discharge amount of the melted resin was controlled to form a biaxial oriented film having a thickness of 50 μm. The physical properties of the resulting film-laminated metal sheet are listed in Table 1 below.

Comparative Example 1

A film-laminated metal sheet was obtained similarly to Example 1 except that the laminate pressing contact pressure was set to 16 kgf/cm$^2$. The physical properties of the resulting film-laminated metal sheet are listed in Table 1 below.

Comparative Example 2

A film-laminated metal sheet was obtained similarly to Example 1 except that the laminate roll was not cooled and the temperature was set to 30° C. The physical properties of the resulting film-laminated metal sheet are listed in Table 1 below.

Comparative Example 3

A film-laminated metal sheet was obtained similarly to Example 1 except that the resin film was water-cooled 1.0 second after thermocompression. The physical properties of the resulting film-laminated metal sheet are listed in Table 1 below.

[Evaluation]

The evaluation results of the suitability for an organic EL device substrate in Examples 1 to 10 and Comparative Examples 1 to 3 are also listed in Table 1 below. As shown in Table 1, in Comparative Examples 1 to 3, the suitability for an organic EL device substrate and/or the organic EL device light emission appearance was a grade C (fail). On the other hand, in Examples 1 to 10, the suitability for an organic EL device substrate and the organic EL device light emission appearance were a grade B (good) or higher. It was thus confirmed that the present invention can provide a film-laminated metal sheet that satisfies smoothness and heat resistance required for a flexible device substrate. Furthermore, the film-laminated metal sheet in the present invention has excellent characteristics as a flexible device substrate, such as flexibility, gas barrier characteristics, low environmental impact, and high productivity.

resistance, flexibility, and gas barrier characteristics required for substrate for flexible devices.

The invention claimed is:

1. A film-laminated metal sheet that is suitable for use as a substrate in a flexible device that is capable of being bent, the film-laminated metal sheet comprising a metal sheet coated with a resin film on at least one surface, wherein
an arithmetic mean height Sao of a surface of the resin film is 3.0 nm or smaller, and
an arithmetic mean height change ratio $\{(Sa_1/Sa_0) \times 100\}$ of the surface of the resin film is 80% to 120%, where $Sa_1$ denotes an arithmetic mean height of the surface of the resin film after thermal treatment at 100° C.

2. The film-laminated metal sheet according to claim 1, wherein a ten-point height $S10z_0$ of the surface of the resin film is 50 nm or smaller.

3. The film-laminated metal sheet according to claim 1, wherein a ten-point height change ratio $\{(S10z_1/S10z_0) \times 100\}$ of the surface of the resin film is 80% to 120%, where $S10z_1$ denotes a ten-point height of the surface of the resin film after thermal treatment at 100° C.

4. The film-laminated metal sheet according to claim 2, wherein a ten-point height change ratio $\{(S10z_1/S10z_0) \times 100\}$ of the surface of the resin film is 80% to 120%, where $S10z_1$ denotes a ten-point height of the surface of the resin film after thermal treatment at 100° C.

TABLE 1

| | | | Example 1 | Example 2 | Example 3 | Example 4 | Example 5 | Example 6 | Example 7 | Example 8 | Example 9 | Example 10 | Comparative Example 1 | Comparative Example 2 | Comparative Example 3 |
|---|---|---|---|---|---|---|---|---|---|---|---|---|---|---|---|
| Arithmetic mean height | $Sa_0$ | nm | 0.47 | 0.45 | 1.1 | 0.78 | 0.49 | 0.69 | 0.42 | 0.44 | 2.8 | 0.39 | 0.40 | 3.1 | 0.75 |
| | $Sa_1$ | nm | 0.50 | 0.47 | 1.2 | 0.83 | 0.45 | 0.55 | 0.50 | 0.50 | 2.6 | 0.40 | 0.49 | 3.3 | 0.91 |
| Arithmetic mean height change ratio $(Sa_1/Sa_0) \times 100$ | | % | 106 | 104 | 109 | 106 | 92 | 80 | 119 | 114 | 93 | 103 | 123 | 106 | 121 |
| Ten-point height | $S10z_0$ | nm | 35 | 23 | 49 | 38 | 32 | 45 | 36 | 38 | 48 | 35 | 22 | 53 | 40 |
| | $S10z_1$ | nm | 37 | 24 | 52 | 41 | 30 | 41 | 42 | 43 | 43 | 36 | 27 | 57 | 47 |
| Ten-point height change ratio $(S10z_1/S10z_0) \times 100$ | | % | 106 | 104 | 106 | 108 | 94 | 91 | 117 | 113 | 90 | 103 | 123 | 108 | 118 |
| Glossiness | | — | 118 | 115 | 111 | 113 | 113 | 102 | 116 | 115 | 98 | 128 | 108 | 112 | 112 |
| Coating resin film thickness | | μm | 30 | 30 | 30 | 30 | 30 | 30 | 30 | 30 | 10 | 50 | 30 | 30 | 30 |
| Resin composition | | — | PET | PEN | PET | PET | PET | PET | PET | PET | PET | PET | PET | PET | PET |
| Resin film melting point | | ° C. | 254 | 265 | 254 | 254 | 254 | 254 | 254 | 254 | 254 | 254 | 254 | 254 | 254 |
| Resin film glass transition temperature | | ° C. | 80 | 120 | 80 | 80 | 80 | 80 | 80 | 80 | 80 | 80 | 80 | 80 | 80 |
| Suitability for organic EL device substrate | | | A | A | B | B | A | B | B | B | B | A | C | C | C |
| Organic EL device light emission appearance | | | A | A | B | A | A | B | B | B | B | B | C | C | B |

INDUSTRIAL APPLICABILITY

The present invention can provide a film-laminated metal sheet, a substrate for a flexible device, and a substrate for an organic EL device that have low environmental impact and high productivity in addition to satisfying smoothness, heat 5. The film-laminated metal sheet according to claim 1, wherein a glossiness of the surface of the resin film is 100 or more.

6. The film-laminated metal sheet according to claim 2, wherein a glossiness of the surface of the resin film is 100 or more.

7. The film-laminated metal sheet according to claim 1, wherein a thickness of the resin film is 10 μm to 50 μm.

8. The film-laminated metal sheet according to claim 2, wherein a thickness of the resin film is 10 μm to 50 μm.

9. The film-laminated metal sheet according to claim 1, wherein 80 mass % or more of a component in the resin film is a polyester resin.

10. The film-laminated metal sheet according to claim 2, wherein 80 mass % or more of a component in the resin film is a polyester resin.

11. The film-laminated metal sheet according to claim 1, wherein the metal sheet is coated with the resin film by thermocompression lamination.

12. The film-laminated metal sheet according to claim 2, wherein the metal sheet is coated with the resin film by thermocompression lamination.

13. A substrate that is suitable for use in a flexible device that is capable of being bent, the substrate comprising a film-laminated metal sheet, the film-laminated metal sheet comprising a metal sheet coated with a resin film on at least one surface, wherein
   an arithmetic mean height Sao of a surface of the resin film is 3.0 nm or smaller, and
   an arithmetic mean height change ratio $\{(Sa_1/Sa_0) \times 100\}$ of the surface of the resin film is 80% to 120%, where $Sa_1$ denotes an arithmetic mean height of the surface of the resin film after thermal treatment at 100° C.

14. The substrate that is suitable for use in the flexible device according to claim 13, wherein a ten-point height $S10z_0$ of the surface of the resin film is 50 nm or smaller.

15. A substrate suitable for use in an organic EL device, the substrate comprising a film-laminated metal sheet, the film-laminated metal sheet comprising a metal sheet coated with a resin film on at least one surface, wherein
   an arithmetic mean height Sao of a surface of the resin film is 3.0 nm or smaller, and
   an arithmetic mean height change ratio $\{(Sa_1/Sa_0) \times 100\}$ of the surface of the resin film is 80% to 120%, where $Sa_1$ denotes an arithmetic mean height of the surface of the resin film after thermal treatment at 100° C.

16. The substrate suitable for use in the organic EL device according to claim 15, wherein a ten-point height $S10z_0$ of the surface of the resin film is 50 nm or smaller.

17. The film-laminated metal sheet according to claim 9, wherein the polyester resin is selected from the group consisting of polyethylene terephthalate, polyethylene naphthalate, and a mixture of polyethylene terephthalate and polyethylene naphthalate.

18. A flexible device that includes the substrate according to claim 13.

19. The flexible device according to claim 18, wherein the flexible device is an organic EL device.

20. The film-laminated metal sheet according to claim 1, wherein a thickness of the metal sheet is 0.5 mm or less.

21. The film-laminated metal sheet according to claim 1, wherein a thickness of the metal sheet is in a range of from 0.1 mm to 0.3 mm.

* * * * *